United States Patent
Shim et al.

(10) Patent No.: US 7,435,644 B2
(45) Date of Patent: Oct. 14, 2008

(54) METHOD OF MANUFACTURING CAPACITOR OF SEMICONDUCTOR DEVICE

(75) Inventors: Woo-Gwan Shim, Gyeonggi-do (KR); Jung-Min Oh, Incheon Metropolitan (KR); Chang-Ki Hong, Gyeonggi-do (KR); Sang-Jun Choi, Seoul (KR); Sang-Yong Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 107 days.

(21) Appl. No.: 11/329,577

(22) Filed: Jan. 11, 2006

(65) Prior Publication Data
US 2006/0189064 A1 Aug. 24, 2006

(30) Foreign Application Priority Data
Feb. 2, 2005 (KR) .................. 10-2005-0009683

(51) Int. Cl.
*H01L 21/8242* (2006.01)
(52) U.S. Cl. .................. 438/254; 438/397; 438/723; 438/743; 438/756
(58) Field of Classification Search .................. 438/239, 438/253–254, 381, 396–397, 738, 743, 756, 438/723
See application file for complete search history.

(56) References Cited

U.S. PATENT DOCUMENTS

| | | | | |
|---|---|---|---|---|
| 5,234,540 A | * | 8/1993 | Grant et al. ................... 216/63 |
| 6,667,502 B1 | * | 12/2003 | Agarwal et al. ............. 257/296 |
| 6,822,280 B2 | * | 11/2004 | Ito et al. ..................... 257/296 |
| 7,067,385 B2 | * | 6/2006 | Manning ..................... 438/387 |
| 7,166,882 B2 | * | 1/2007 | Nakamura et al. ........... 257/306 |
| 2003/0085420 A1 | * | 5/2003 | Ito et al. ..................... 257/309 |
| 2004/0018683 A1 | | 1/2004 | Kim et al. |
| 2005/0048717 A1 | * | 3/2005 | Ito et al. ..................... 438/253 |
| 2005/0051822 A1 | * | 3/2005 | Manning ..................... 257/296 |
| 2005/0161720 A1 | * | 7/2005 | Park ........................... 257/296 |
| 2006/0014344 A1 | * | 1/2006 | Manning ..................... 438/243 |
| 2006/0046420 A1 | * | 3/2006 | Manning ..................... 438/396 |
| 2006/0063324 A1 | * | 3/2006 | Park et al. ................... 438/239 |
| 2006/0211163 A1 | * | 9/2006 | Ouellet et al. ................ 438/50 |
| 2007/0048976 A1 | * | 3/2007 | Raghu ........................ 438/478 |
| 2007/0049041 A1 | * | 3/2007 | Rana .......................... 438/736 |
| 2007/0202687 A1 | * | 8/2007 | Han ........................... 438/629 |

FOREIGN PATENT DOCUMENTS

KR 10-2004-0008626 1/2004
KR 10-2004-0074459 8/2004

* cited by examiner

*Primary Examiner*—M. Wilczewski
*Assistant Examiner*—Toniae M. Thomas
(74) *Attorney, Agent, or Firm*—Myers Bigel Sibley & Sajovec, P.A.

(57) ABSTRACT

Provided is a method of manufacturing a capacitor of a semiconductor device, which can prevent tilting or an electrical short of a lower electrode. In the method, a mesh-type bridge insulating layer is formed above the contact plug on a mold oxide layer. The mold oxide layer and the bridge insulating layer are etched to define an electrode region. The mold oxide layer is removed using an etching gas having an etch selectivity of 500 or greater for the mold oxide layer with respect to the bridge insulating layer.

20 Claims, 10 Drawing Sheets

METHOD OF MANUFACTURING CAPACITOR OF SEMICONDUCTOR DEVICE

CROSS-REFERENCE TO RELATED PATENT APPLICATION

This application claims the benefit of Korean Patent Application No. 10-2005-0009683, filed on Feb. 2, 2005, in the Korean Intellectual Property Office, the disclosure of which is incorporated herein in its entirety by reference.

FIELD OF THE INVENTION

The present invention relates to a method of manufacturing a capacitor of a semiconductor device, and more particularly, to a method of manufacturing a capacitor of a semiconductor device, which can prevent tilting or an electrical short of a lower electrode by using a bridge insulating layer.

BACKGROUND OF THE INVENTION

As semiconductor devices become more highly integrated, cell capacitors for storing data in memory devices must occupy a smaller area. A cell capacitor must have sufficient capacitance so as to prevent malfunction due to a soft error or noise. Various efforts have been made to manufacture a cell capacitor in a highly integrated memory device having a capacitance of at least 30 fF or more. For example, a cylindrical cell capacitor having a maximized occupation area in the same space so as to increase its capacitance has been developed.

Figure 1:
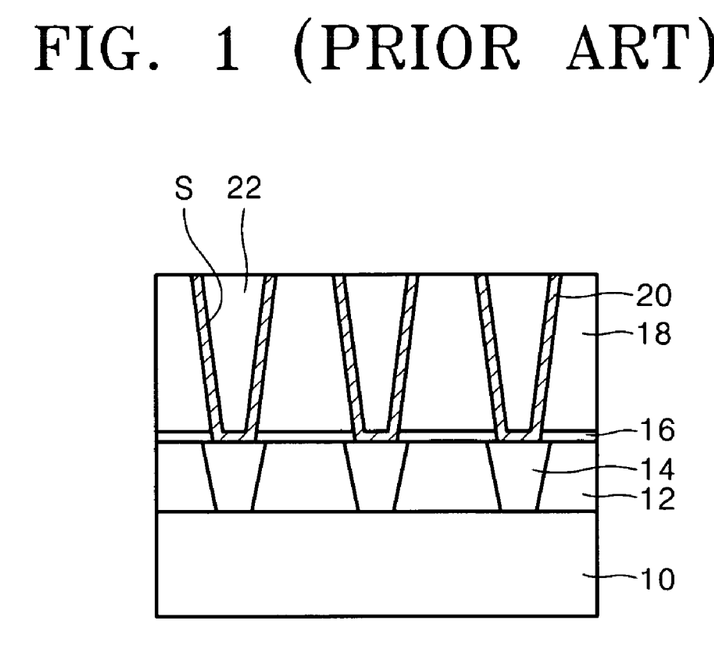
FIGS. 1 and 2 are sectional views illustrating a method of forming a lower electrode of a conventional cylindrical capacitor.
Figure 2:
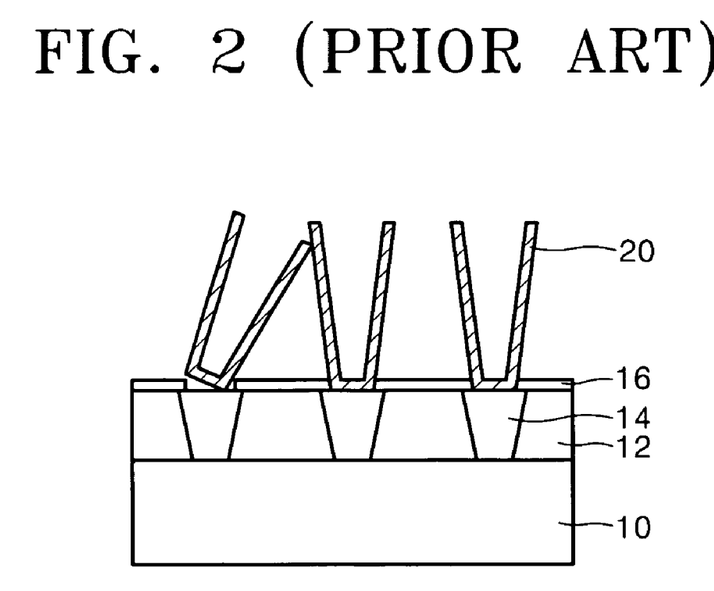

FIGS. 1 and 2 are sectional views illustrating a method of forming a lower electrode of a conventional cylindrical capacitor.

Referring to FIGS. 1 and 2, an interlayer insulating layer 12 is formed on a semiconductor substrate 10, and contact plugs 14 are formed at predetermined intervals in the interlayer insulating layer 12 through a conventional method. An etch barrier layer 16 and a mold oxide layer (sacrifice layer) 18 containing an electrode region S for exposing the contact plugs 14 are sequentially stacked on the contact plugs 14 and the interlayer insulating layer 12. The mold oxide layer 18 defines the height of the capacitor, and is deposited to a thickness of 1.5-2 μm, for example.

Thereafter, sidewalls of the mold oxide layer 18 exposed to the electrode region S and part of the upper surfaces of the contact plugs 14 are blanketed with a conductive layer, for example, a doped polysilicon layer for a lower electrode 20. The electrode region S is filled with a buffer oxide layer 22 so as to protect the doped polysilicon layer. The lower electrode 20 is formed in the electrode region S by planarizing the polysilicon layer and the buffer oxide layer 22 through a chemical and mechanical polishing (CMP) process or an etch-back process so that an upper surface of the mold oxide layer 18 is exposed.

The height of the capacitor, that is, the thickness of the mold oxide layer 18 may be increased so as to obtain a high capacitance. However, the increase in the thickness of the mold oxide layer 18 makes it difficult to obtain a sufficient etch selectivity between the mold oxide layer 18 and a photoresist pattern (not shown) when etching the mold oxide layer 18 to define the electrode region S. In addition, since the amount of etch gas gradually decreases toward a lower part of the mold oxide layer 18, the sidewalls of the electrode region S may have inclined profiles. That is, the circumference of the lower electrode 20 formed in the electrode region S does not increase linearly from the bottom to the top thereof. Consequently, a gap between the adjacent lower electrodes 20 may become narrow at the tops thereof, which may result in an electrical short between the lower electrodes 20.

After completion of the planarization process, the mold oxide layer 18 and the buffer oxide layer 22, which surround the lower electrode 20, are removed through wet etching. The wet etching is performed using a buffered oxide etchant (BOE) or an HF solution. After completion of the wet etching, the remaining etchant is rinsed with deionized water, and the resultant structure is dried.

Undesirably, the lower electrode 20 may become tilted or a gap between the neighboring conventional lower electrodes 20 may become bridged during the rinsing process and/or the drying process. The inclining or bridging phenomenon often occurs during the drying process.

Figure 3:
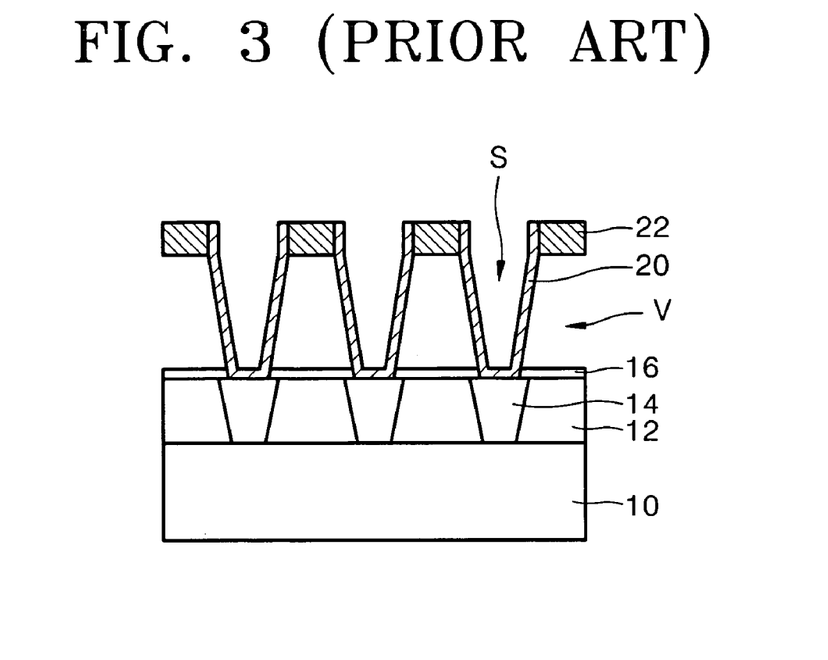
FIG. 3 is a sectional view of a conventional capacitor using a bridge insulating layer.
Figure 4:
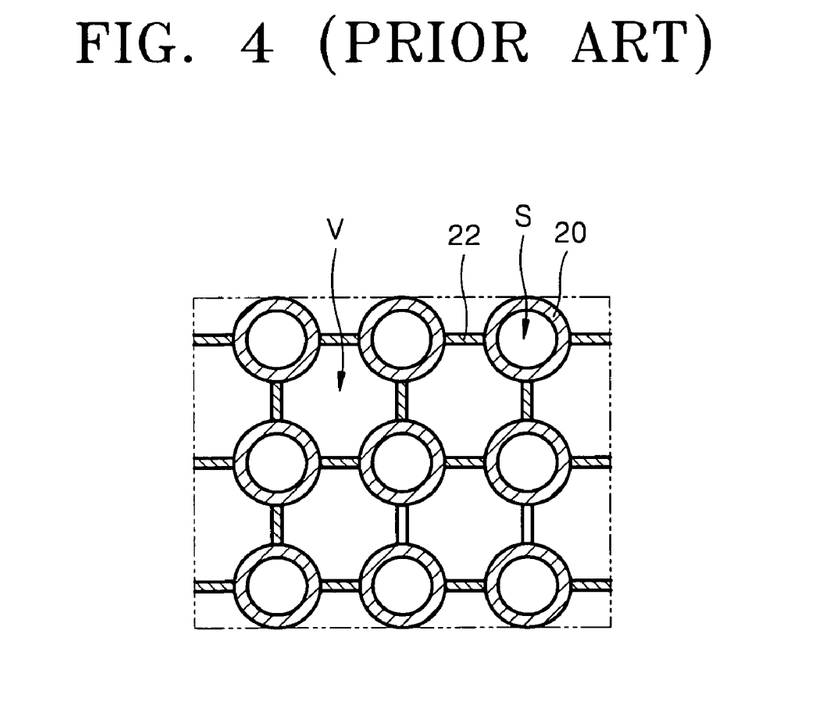
FIG. 4 is a plan view illustrating a drawback of the capacitor shown in FIG. 3.

FIG. 3 is a sectional view of a capacitor using a bridge insulating layer for preventing the bridging and tilting of the lower electrode 20, and FIG. 4 is a plan view illustrating a drawback of the capacitor shown in FIG. 3.

Referring to FIGS. 3 and 4, an upper portion of the mold oxide layer 18 shown in FIG. 1 is removed and then a bridge insulating layer 22 is formed where the removed portion was in such a way to connect the adjacent lower electrodes 20. Thereafter, the mold oxide layer 18 is removed through the rinsing process and the drying process as illustrated in FIG. 2. When the mold oxide layer 18 is removed, an electrode space V is formed below the bridge insulating layer 22 between the lower electrodes 20. The bridge insulating layer 22 prevents the lower electrodes 20 from tilting or contacting each other.

It is preferable to have a suitable etch selectivity between the mold oxide layer 18 and the bridge insulating layer 22 so as to remove the mold oxide layer 18. However, it is difficult for a conventional aqueous base etchant to provide an etch selectivity greater than 100. Accordingly, the conventional aqueous base etchant cannot provide a satisfactory etch selectivity. When the etch selectivity is small, the bridge insulating layer 22 may be thinned or removed by over-etching during the removing process for the mold oxide layer 18. When the bridge insulating layer 22 is over-etched, the tilting of or contact between the lower electrodes 20 cannot be prevented.

SUMMARY OF THE INVENTION

The present invention provides a method of manufacturing a capacitor of a semiconductor device, which can prevent the tilting or an electrical short of a lower electrode.

According to an embodiment of the present invention, there is provided a method of manufacturing a capacitor of a semiconductor device, including: forming an interlayer insulating layer with a contact plug on a semiconductor substrate; forming a mold oxide layer on the contact plug and the interlayer insulating layer; forming a mesh-type bridge insulating layer formed in a region above the contact plug on the mold oxide layer; etching the mold oxide layer and the bridge insulating layer to define an electrode region; and removing the mold oxide layer using an etching gas with an etch selectivity of 500 or greater for the mold oxide layer with respect to the bridge insulating layer.

The mold oxide layer may be selected from the group consisting of a TEOS layer, a BPSG layer, and a combination thereof, and may have a thickness of between about 1.5-4 μm.

The forming of the bridge insulating layer may include: forming a mesh-type trench crossing the contact plug on the mold oxide layer; filling the trench with an insulating material layer; and planarizing the insulating material layer to expose an upper surface of the mold oxide layer. The trench may have a greater width than the contact plug.

The bridge insulating layer may be a silicon nitride layer or a silicon carbide layer. The height and width of the bridge insulating layer may be determined in consideration of a thickness of the mold oxide layer and the etch selectivity between the bridge insulating layer and the mold oxide layer. The etching gas may include an anhydrous HF gas and water vapor. A flow rate of the anhydrous HF gas may be between about 100-2000 sccm. The mold oxide layer may be removed using a catalyst gas selected from the group consisting of IPA, an alcoholic material including $CH_3OH$, and a carboxylic acid including $CH_3COOH$. A flow rate of the IPA may be between about 50-200 sccm.

The mold oxide layer may be removed while maintaining the temperature of the semiconductor substrate at between about 0-60° C. About 40 Å of the bridge insulating layer or less may be etched.

According to another embodiment of the present invention, there is provided a method of manufacturing a capacitor of a semiconductor device, including: forming an interlayer insulating layer with a contact plug on a semiconductor substrate; forming a mold oxide layer on the contact plug and the interlayer insulating layer; forming a bridge insulating layer formed of a mesh-type silicon nitride layer crossing the contact plug on the mold oxide layer; etching the mold oxide layer and the bridge insulating layer to define an electrode region; removing the mold oxide layer using an etching gas with an etch selectivity of about 500 or greater for the mold oxide layer with respect to the bridge insulating layer; and removing an ammonium silicon fluoride layer formed on the bridge insulating layer.

The forming of the bridge insulating layer may include: forming a mesh-type trench crossing the contact plug on the mold oxide layer; filling the trench with an insulating material layer; and planarizing the insulating material layer to expose an upper surface of the mold oxide layer.

The ammonium silicon fluoride layer may be formed on the silicon nitride layer. The ammonium silicon fluoride layer may be an etch barrier layer for preventing the silicon nitride layer from being etched by the etching gas. The ammonium silicon fluoride layer may be removed by an annealing process at between about 150-300° C. The ammonium silicon fluoride layer may be removed using deionized water.

BRIEF DESCRIPTION OF THE DRAWINGS

The above and other features and advantages of the present invention will become more apparent by describing in detail exemplary embodiments thereof with reference to the attached drawings in which:

FIGS. 6A through 12A are plan views illustrating a method of manufacturing a capacitor according to an embodiment of the present invention; and FIGS. 6B through 12B are sectional views taken along line B-B in FIGS. 6A through 12A, respectively.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Like numbers refer to like elements throughout. In the figures, the thickness of certain lines, layers, components, elements or features may be exaggerated for clarity. Broken lines illustrate optional features or operations unless specified otherwise. All publications, patent applications, patents, and other references mentioned herein are incorporated herein by reference in their entireties.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of "over" and "under". The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a "first" element, component, region, layer or section discussed below could also be termed a "second" element, component, region, layer or section without departing from the teachings of the present invention. The sequence of operations (or steps) is not limited to the order presented in the claims or figures unless specifically indicated otherwise.

A mold oxide layer (108 in FIG. 6) according to an embodiment of the present invention may be a TEOS (TetraEthylOxySilane) layer, a BPSG (boron-doped phosphosilicate glass) layer, or a combination thereof. An etchant according to an embodiment of the present invention may provide an etch selectivity of at least 500 or more between the mold oxide layer 108 and a bridge insulating layer (112 in FIGS. 8A and 8B).

Figure 5:
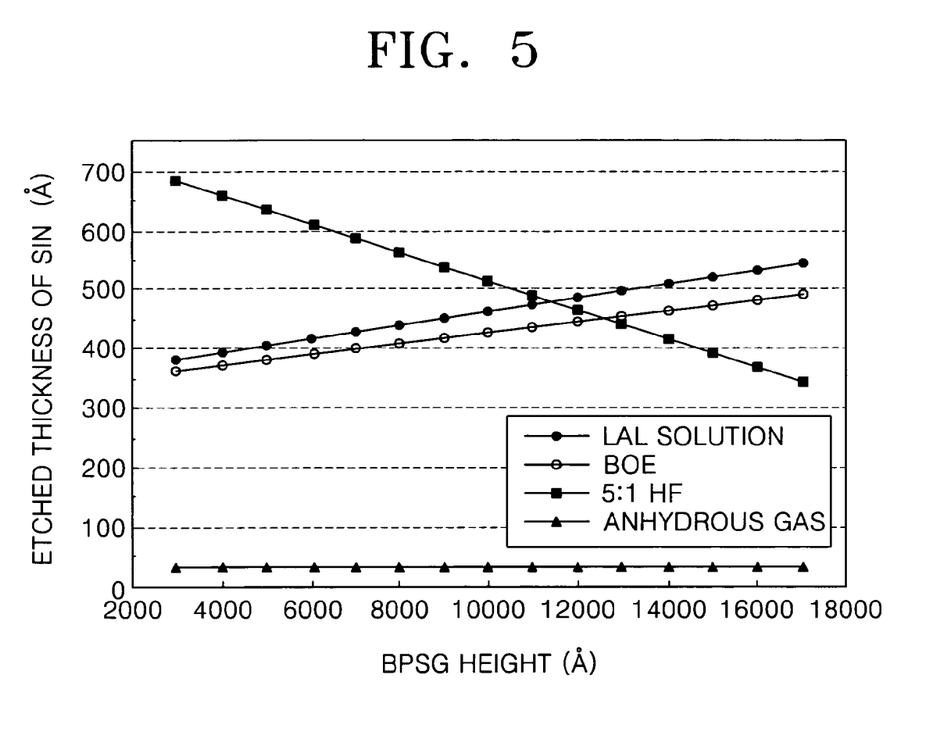
FIG. 5 is a graph illustrating respective etched amounts of a mold oxide layer formed of a TEOS layer and a BPSG layer which result using conventional etchants and an etching gas according to an embodiment of the present invention.

FIG. 5 is a graph illustrating respective etched amounts of a mold oxide layer formed of a TEOS layer and a BPSG layer which result using conventional etchants and an etching gas according to an embodiment of the present invention. In the graph, a horizontal axis represents the thickness of the BPSG layer of the mold oxide layer 108 having a total thickness of 2000 Å, and a vertical axis represents an etched amount of a silicon nitride (SiN) layer used as the bridge insulating layer 112. The etching gas according to an embodiment of the present invention includes an anhydrous HF gas, and the conventional etchants includes a LAL solution, a BOE, and 5:1H$_2$O:HF solution.

Referring to FIG. 5, the conventional etchants each etch about 350 Å of the silicon nitride layer while etching the 2000 Å thick mold oxide layer 108. However, the etching gas according to an embodiment of the present invention etches about 40 Å of the silicon nitride layer while etching the 2000 Å thick mold oxide layer 108. Accordingly, it can be seen that the etching gas according to an embodiment of the present invention etches the silicon nitride layer considerably less than the conventional etchants. That is, the etching gas according to an embodiment of the present invention etches less than about ⅛ of the silicon nitride layer that the conventional etchants etch.

Table 1 below indicates how much the TEOS layer and the BPSG layer constituting the mold oxide layer 108, and a silicon nitride layer and an silicon carbide (SiC) layer constituting the bridge insulating layer 112 were etched, and the etch selectivity of each of the TEOS layer and the BPSG layer with respect to the silicon nitride layer. The SiC layer has an excellent etch barrier property and thus can be a very excellent bridge insulating layer 112. However, a silicon nitride layer is usually used as the bridge insulating layer 112 during the capacitor manufacturing process. Accordingly, the description will be focused on the bridge insulating layer 112 being the silicon nitride layer.

TABLE 1

| Sort | Etched Amount (Å/minute) | | | | Etch Selectivity | |
|---|---|---|---|---|---|---|
| | TEOS | BPSG | SiN | SiC | TEOS/SiN | BPSG/SiN |
| LAL Solution | 975 | 580 | 12 | 11.7 | 81 | 48 |
| BOE | 4741 | 2097 | 43 | ≈0 | 110 | 48.7 |
| 5:1 HF Solution | 1750 | 5787 | 47 | ≈0 | 37 | 123.2 |
| Anhydrous HF Gas | 970 | 985 | below 1 | below 1 | 900 or more | 950 or more |

It can be seen from Table 1 that the etch selectivity of each of the TEOS layer and the BPSG layer with respect to the bridge insulating layer 112 when the etching gas according to an embodiment of the present invention is used is 900. Accordingly, the etch selectivity of the mold oxide layer 108 made of a combination of the TEOS layer and the BPSG layer with respect to the bridge insulating layer 112 can be 900 or greater. However, when considering the quality or density of the TEOS layer or the BPSG layer, it is preferable that the etch selectivity may be 500 or greater.

The etching gas according to an embodiment of the present invention removes the mold oxide layer 108 according to the chemical reaction formula $$4HF(g) + SiO_2 = SiF_4(g) + 2H_2O(g) \quad (1).$$

Here, generated H$_2$O(g) acts as a catalyst for catalyzing the etching of the SiO$_2$ layer. When there is no H$_2$O(g) produced, the etching action is stopped.

The etching gas according to an embodiment of the present invention removes the silicon nitride layer according to the chemical reaction formula 2

$$Si_3N_4 + HF(g) = (NH_4)_2SiF_6 \quad (2).$$

Here, (NH$_4$)$_2$SiF$_6$ (aluminum silicon fluoride) is formed on the silicon nitride layer and prevents the silicon nitride layer from being etched by the etching gas according to an embodiment of the present invention. Accordingly, the etch selectivity of the mold oxide layer 108 with respect to the silicon nitride layer can be 500 or greater.

FIGS. 6A through 12A are plan views illustrating a method of manufacturing a capacitor according to an embodiment of the present invention, and FIGS. 6B through 12B are sectional views taken along line B-B in FIGS. 6A through 12A, respectively.

Figure 6A:
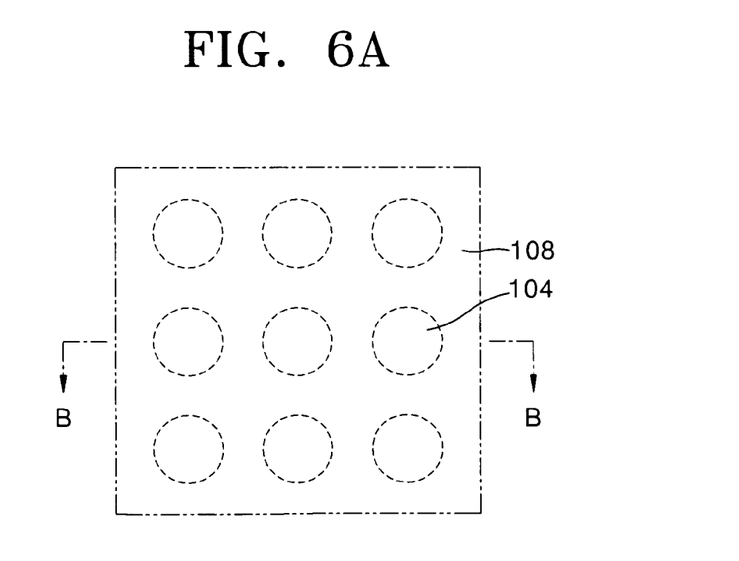
Figure 6B:
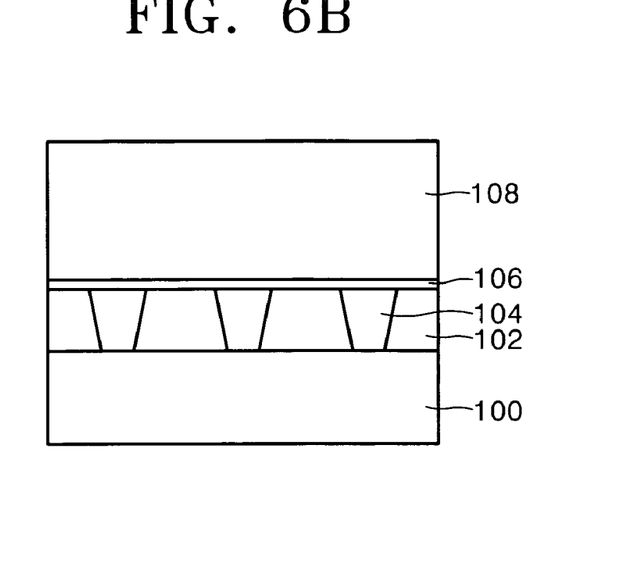

Referring to FIGS. 6A and 6B, an interlayer insulating layer 102 is deposited on a semiconductor substrate 100, for example, a silicon substrate, on which MOS transistors, contact pads and bit lines (not shown) are formed. The interlayer insulating layer 102 may be a silicon oxide layer, and insulates elements on the semiconductor substrate 100 from a lower electrode 116 that will be formed later. Thereafter, a contact hole (not shown) is formed by etching the interlayer insulating layer 102 so that a source region of an MOS transistor (not shown) or a contact pad (not shown) contacting the source region is exposed. A conductive layer is formed by depositing a doped polysilicon layer to fill the contact hole. A lower electrode contact plug 104 is formed in the contact hole by planarizing the doped polysilicon layer through a CMP process or an etch-back process so that an upper surface of the interlayer insulating layer 102 is exposed.

An etch barrier layer 106 and a mold oxide layer 108 are then sequentially deposited on the lower electrode contact plug 104 and the interlayer insulating layer 102. The mold oxide layer 108 defines the heights of the capacitor and the lower electrode 116. By using a bridge insulating layer 112 (see FIG. 8A), the mold oxide layer 108 can be deposited to a thickness greater than that of the conventional mold oxide layer, for example, a thickness of about 1.5-4 µm. In the present embodiment, the mold oxide layer 108 is a complex layer with a thickness of about 2000 Å that is made of a combination of a TEOS layer and a BPSG layer. That is, the mold oxide layer 108 is formed by sequentially forming a TEOS layer of about 1800 Å and a BPSG layer to a thickness of about 200 Å. The TEOS layer may be a plasma-enhanced (PE)-TEOS layer. The etch barrier layer 106 is formed to protect the interlayer insulating layer 102, and may be formed of a material having a different etch selectivity than a silicon oxide layer, for example a silicon nitride layer or a silicon oxide nitride (SiON) layer.

Figure 7A:
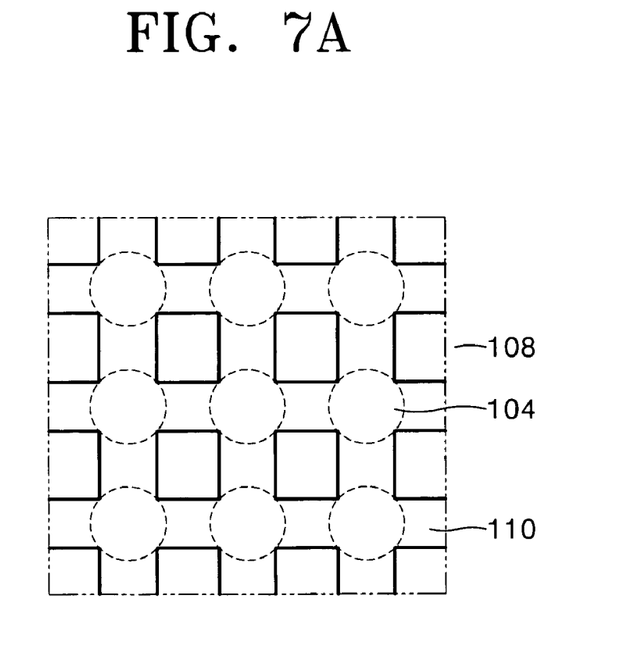
Figure 7B:
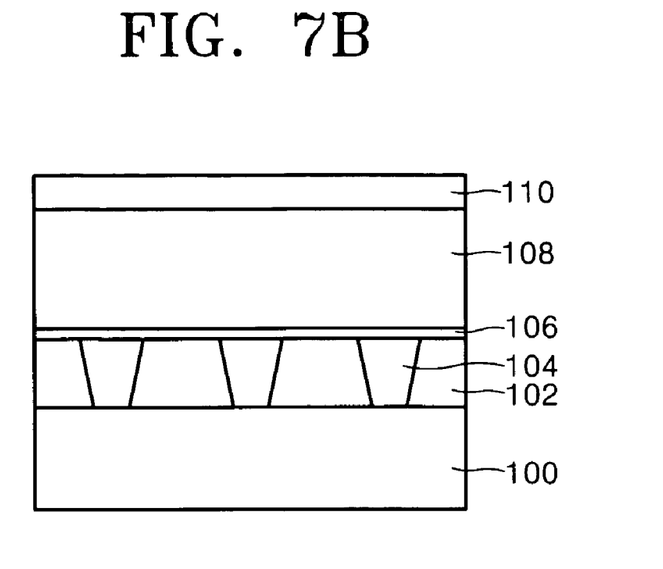

Referring to FIGS. 7A and 7B, a mesh-type trench 110 is formed on the mold oxide film 108 to cross over the lower electrode contact plug 104. The width of the trench 110 may be smaller than the diameter of the contact plug 104. To produce the trench 110, the mold oxide layer 108 can be removed by the etching gas according to an embodiment of the present invention or by conventional etchants. The etching gas according to an embodiment of the present invention will be described in detail with reference to FIGS. 12A and 12B.

Figure 8A:
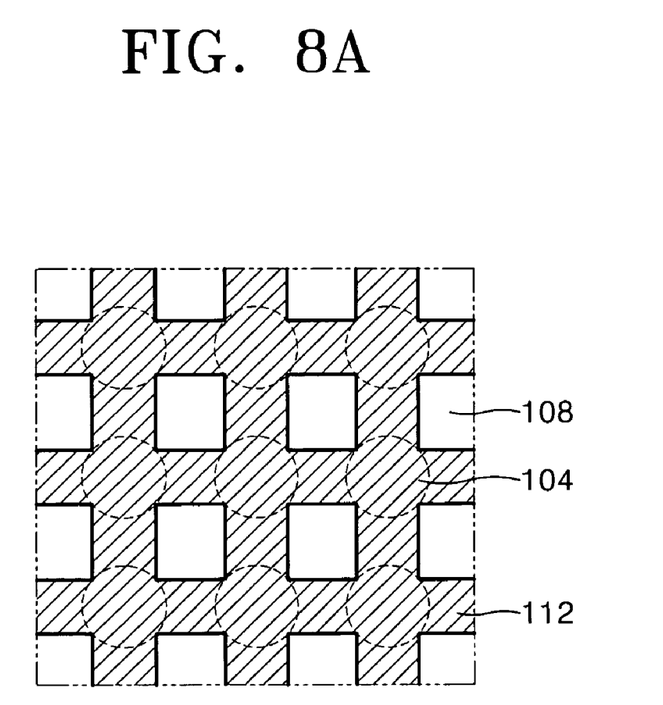
Figure 8B:
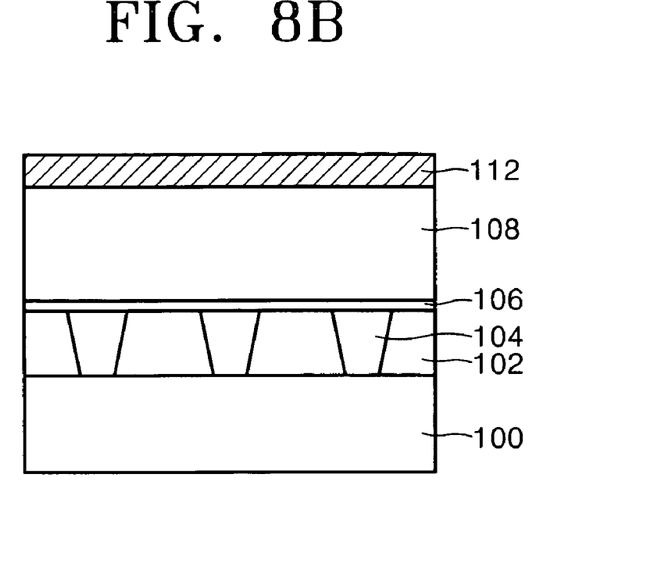

Referring to FIGS. 8A and 8B, a bridge insulating layer 112 is formed in the trench 110 such that an upper surface of the mold oxide layer 108 is exposed. The bridge insulating layer 112 is a silicon nitride layer and exhibits an etch selectivity of about 500 or greater with respect to the mold oxide layer 108 when using the etching gas according to an embodiment of the present invention. The bridge insulating layer 112 is formed by depositing an SiN material layer to fill the trench 110 and planarizing the SiN material layer to expose the upper surface of the mold oxide layer 108. The thickness and width of the bridge insulating layer 112 may be determined in consideration of the thickness of the mold oxide layer 108, that is, the height of a capacitor, and the etch selectivity of the bridge insulating 112 with respect to the mold oxide layer 108.

Figure 9A:
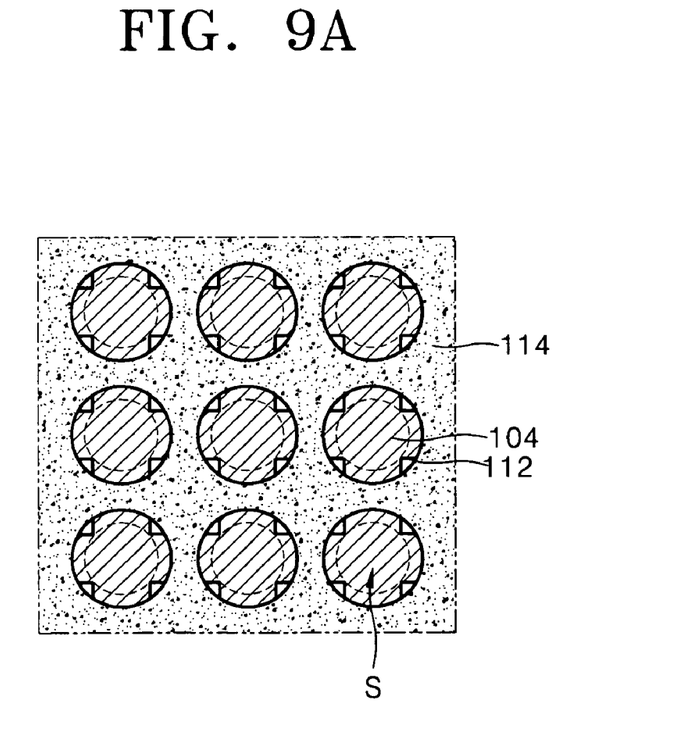
Figure 9B:
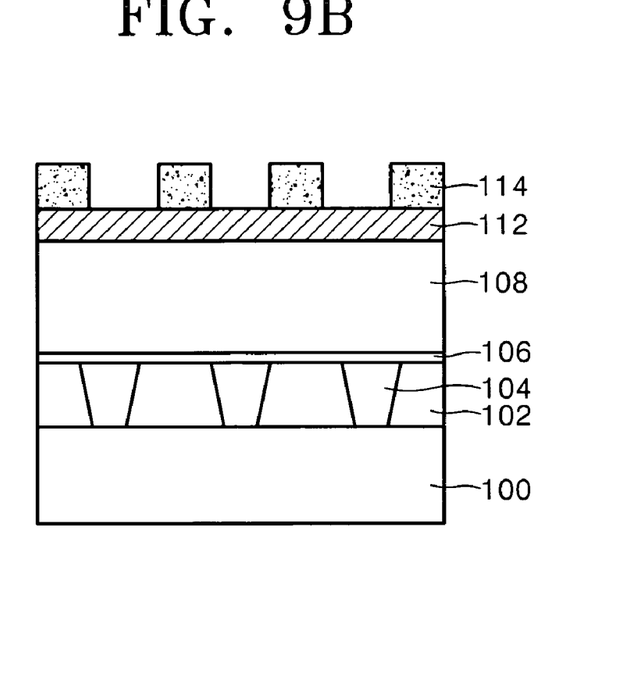

Referring to FIGS. 9A and 9B, a photoresist pattern 114 defining an electrode region S is formed on the mold oxide layer 108 and the bridge insulating layer 112 through a conventional method.

Figure 10A:
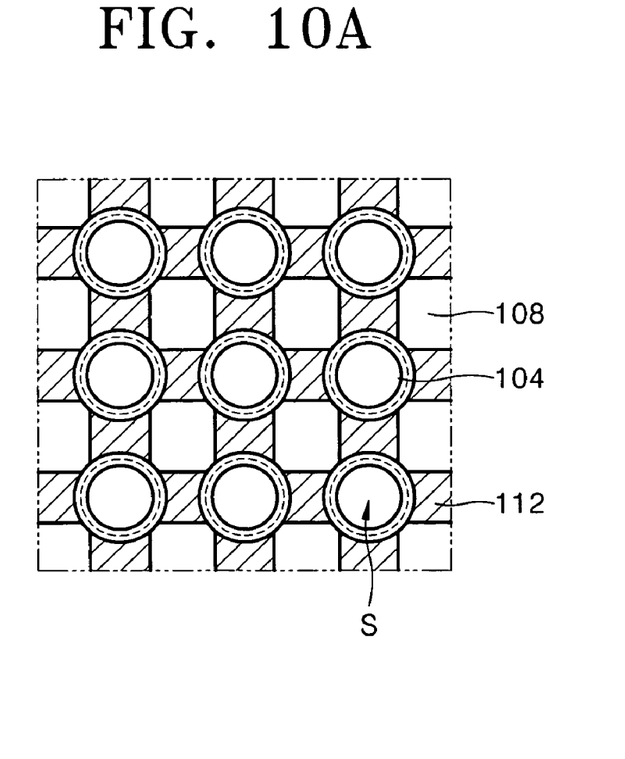
Figure 10B:
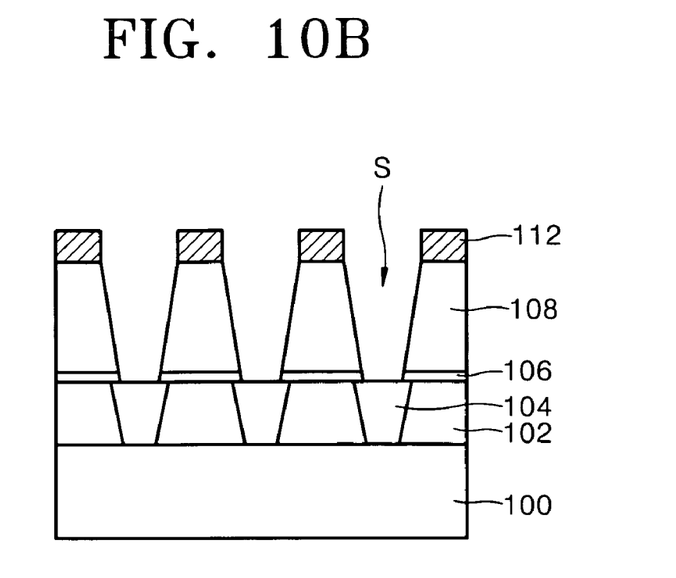

Referring to FIGS. 10A and 10B, the electrode region S is formed by etching the mold oxide layer 108 and the etch barrier layer 106 so that the lower electrode contact plug 104 is exposed using the photoresist pattern 114 as an etch mask. Since the electrode regions S are separated from each other by the bridge insulating layer 112, the gap between the electrode regions need not increase from the bottom to the top of the electrode region S. Accordingly, the gap between the electrodes regions S is about 40 nm or less, and may be about 20-40 nm at the bottom portion thereof.

Figure 11A:
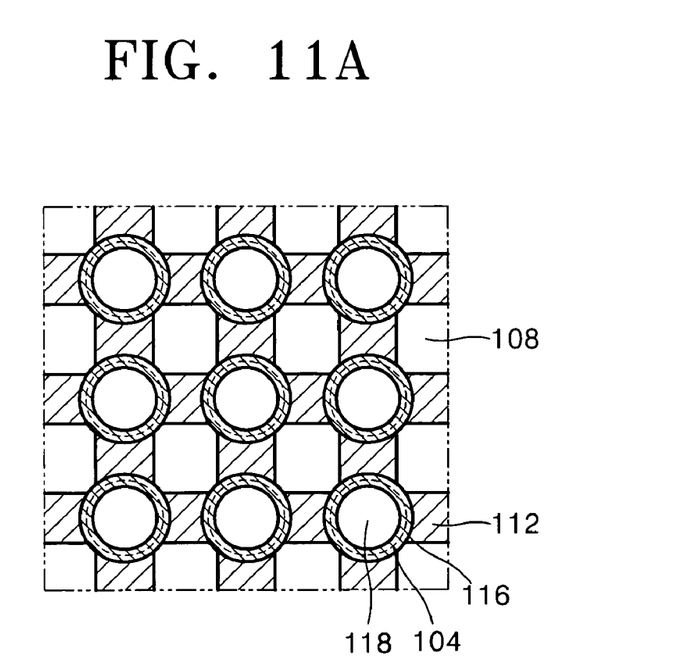
Figure 11B:
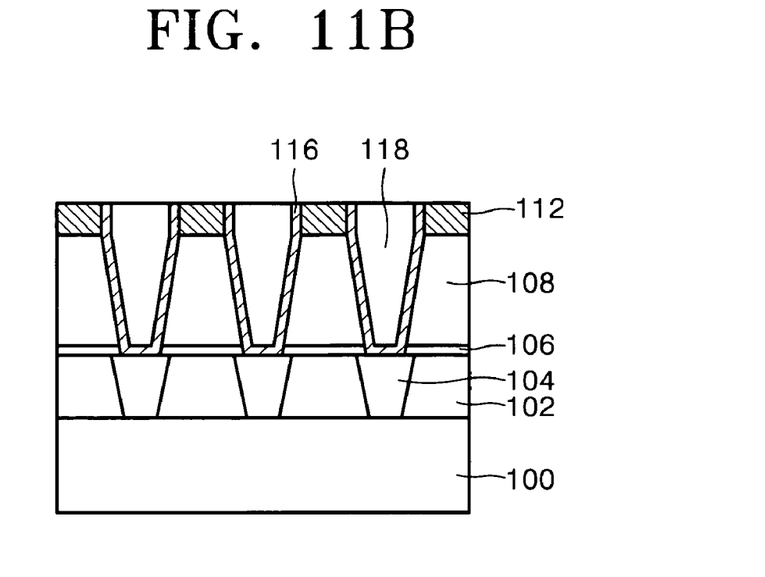

Referring to FIGS. 11A and 11B, sidewalls of the mold oxide layer 108 exposed to the electrode region S and an upper surface of the contact plug 104 are blanketed with a lower electrode conductive layer, for example, a doped polysilicon layer. Thereafter, a buffer oxide layer 118 is deposited on an inner surface of the lower electrode conductive layer. The buffer oxide layer 118 may have the same etch selectivity to the bridge insulating layer 112 as the mold oxide layer 108, and completely fills the electrode region S to be fully filled. The lower electrode 116, which is concave or cylindrical, is formed in the electrode region S by planarizing the buffer oxide layer 118 and the doped polysilicon layer through a CMP process or an etch-back process so that the surface of the mold oxide layer 108 is exposed.

Figure 12A:
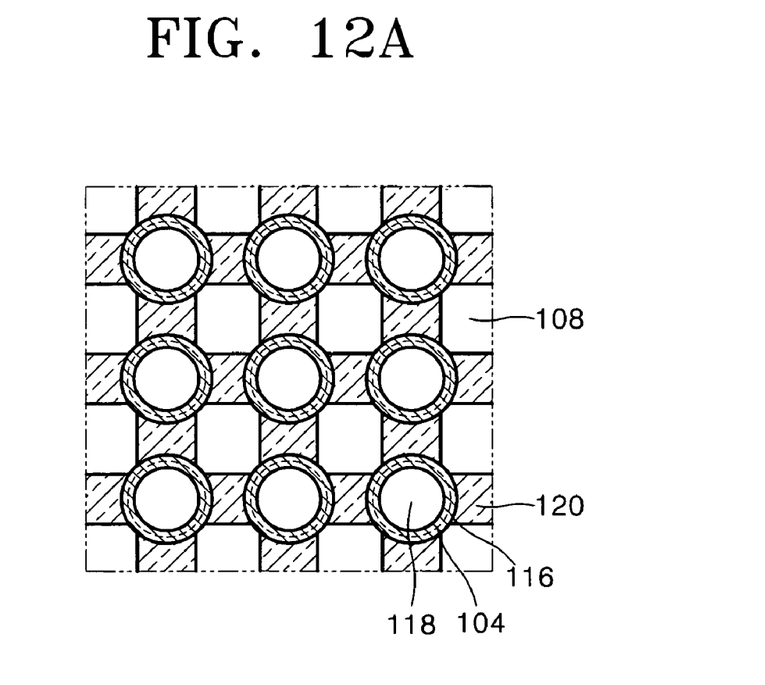
Figure 12B:
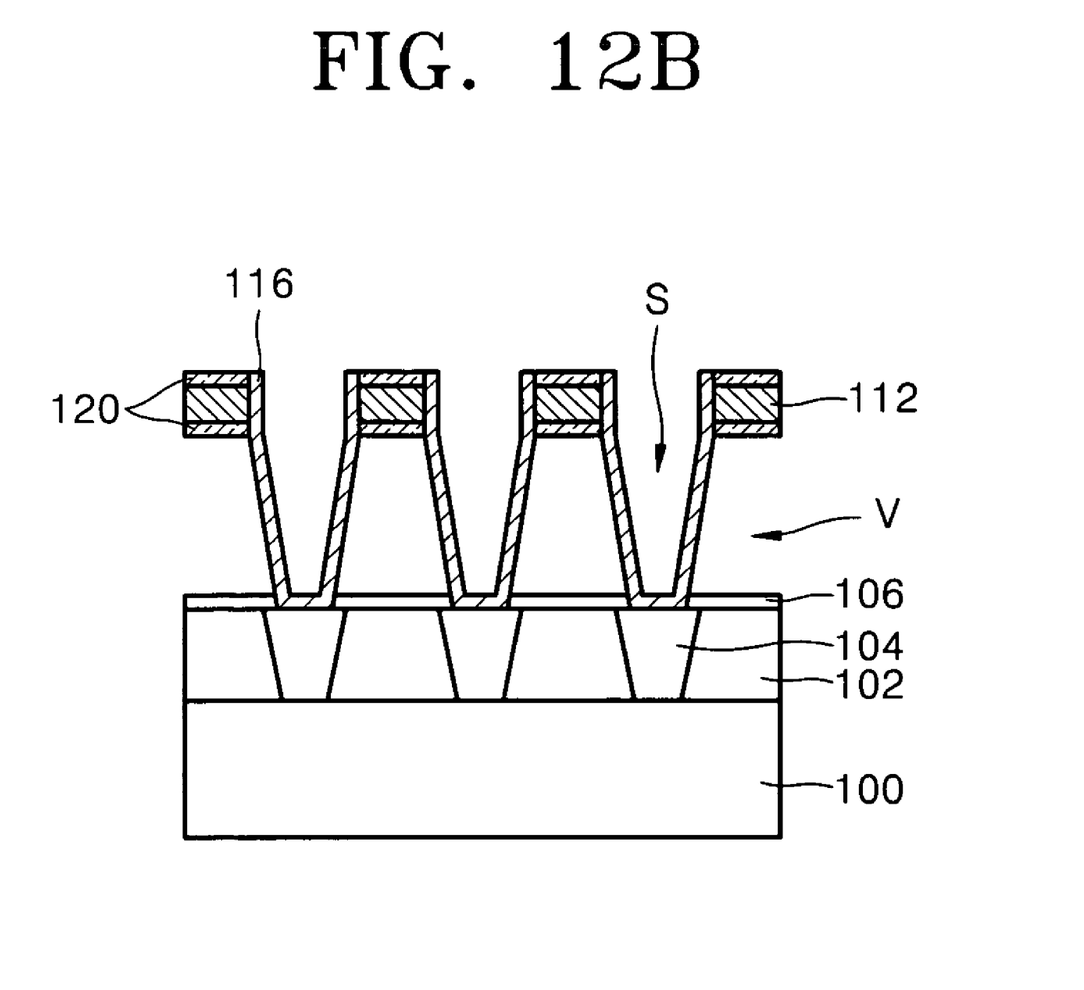

Referring to FIGS. 12A and 12B, after the completion of the planarization process, the mold oxide layer 108 and the buffer oxide layer 118, which surround the lower electrode 116, are removed through dry etching. The mold oxide layer 108 and the buffer oxide layer 118 are dry-etched with a mixed gas of vaporized anhydrous HF and a catalyst gas containing an OH radical. The catalyst gas may be a highly volatile material, such as an alcoholic material including $CH_3OH$ or a carboxylic acid including $CH_3COOH$. The etching gas according to an embodiment of the present invention for etching the mold oxide layer 108 and the buffer oxide layer 118 is a mixed gas of anhydrous HF, isopropyl alcohol (IPA), and/or vapor. The IPA is a solvent for the HF, and catalyzes reactions between the HF and the mold oxide layer 108 and between the HF and the buffer oxide layer 118. This dry-etching process is performed by providing the anhydrous HF at a flow rate of about 100-2000 sccm and providing the IPA at a flow rate of about 50-200 sccm while maintaining the temperature of the wafer at about 0-60° C. When the mold oxide layer 108 is removed, an electrode space is formed in the electrode region S within the lower electrodes 116. After completion of the dry etching, the remaining etchant is rinsed with deionized water, and the resultant structure is dried.

When the dry etching is completed, an ammonium silicon fluoride layer 120 is formed on the bridge insulation layer 112. The ammonium silicon fluoride layer 120 functions as a passivation layer for preventing the bridge insulating layer 112 from being further etched. The ammonium silicon fluoride layer 120 can be removed through an annealing process performed at about 150-300° C. The ammonium silicon fluoride layer 120 can also be removed with deionized water.

As described above, in the capacitor manufacturing method according to the present invention, the tilting or an electrical short of the lower electrode can be prevented by forming the bridge insulating layer having an etch selectivity of 500 or more with respect to the mold oxide layer.

In addition, the bridge insulating layer formed of an SiN film can have an etch selectivity of 500 or more with respect to the mold oxide layer by forming the ammonium silicon fluoride layer capable of preventing the mold oxide layer from being etched by the etching gas containing an anhydrous HF gas according to the present invention.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. The invention is defined by the following claims, with equivalents of the claims to be included therein.

What is claimed is:

1. A method of manufacturing a capacitor of a semiconductor device, comprising:
   forming an interlayer insulating layer with a contact plug on a semiconductor substrate;
   forming a mold oxide layer on the contact plug and the interlayer insulating layer;
   forming a mesh-type bridge insulating layer formed in a region above the contact plug on the mold oxide layer;
   etching the mold oxide layer and the bridge insulating layer to define an electrode region; and removing the mold oxide layer using an etching gas with, wherein the etching gas includes an anhydrous HF gas and water vapor and has an etch selectivity of 500 or greater for the mold oxide layer with respect to the bridge insulating layer.

2. The method of claim 1, wherein the mold oxide layer is selected from the group consisting of a TEOS layer, a BPSG layer, and a combination thereof.

3. The method of claim 1, wherein the mold oxide layer has a thickness of about 1.5-4 μm.

4. The method of claim 1, wherein the forming of the bridge insulating layer comprises:
   forming a mesh-type trench crossing the contact plug on the mold oxide layer;
   filling the trench with an insulating material layer; and
   planarizing the insulating material layer to expose an upper surface of the mold oxide layer.

5. The method of claim 4, wherein the trench has a width greater than a width of the contact plug.

6. The method of claim 1, wherein the bridge insulating layer is a silicon nitride layer.

7. The method of claim 1, wherein the bridge insulating layer is a silicon carbide layer.

8. The method of claim 1, wherein a height and width of the bridge insulating layer are determined by a thickness of the mold oxide layer and the etch selectivity between the bridge insulating layer and the mold oxide layer.

9. The method of claim 1, wherein a flow rate of the anhydrous HF gas is about 100-2000 sccm.

10. The method of claim 1, wherein the mold oxide layer is removed using a catalyst gas selected from the group consisting of IPA (isopropyl alcohol), an alcoholic material including $CH_3OH$, and a carboxylic acid including $CH_3COOH$.

11. The method of claim 10, wherein a flow rate of the IPA is about 50-200 sccm.

12. The method of claim 1, wherein the mold oxide layer is removed while maintaining the temperature of the semiconductor substrate at about 0-60° C.

13. The method of claim 1, wherein about 40 Å of the bridge insulating layer or less is etched.

14. A method of manufacturing a capacitor of a semiconductor device, comprising:
   forming an interlayer insulating layer with a contact plug on a semiconductor substrate;
   forming a mold oxide layer on the contact plug and the interlayer insulating layer;
   forming a bridge insulating layer comprising a mesh-type silicon nitride layer crossing the contact plug on the mold oxide layer;
   etching the mold oxide layer and the bridge insulating layer to define an electrode region;
   removing the mold oxide layer using an etching gas with an etch selectivity of 500 or greater for the mold oxide layer with respect to the bridge insulating layer; and
   removing an ammonium silicon fluoride layer formed on the bridge insulating layer.

15. The method of claim 14, wherein the forming of the bridge insulating layer comprises:
   forming a mesh-type trench crossing the contact plug on the mold oxide layer;
   filling the trench with an insulating material layer; and
   planarizing the insulating material layer to expose an upper surface of the mold oxide layer.

16. The method of claim 14, wherein the ammonium silicon fluoride layer is formed on the silicon nitride layer.

17. The method of claim 14, wherein the ammonium silicon fluoride layer is an etch barrier layer for preventing the silicon nitride layer from being etched by the etching gas.

18. The method of claim 14, wherein the ammonium silicon fluoride layer is removed by an annealing process at about 150-300° C.

19. The method of claim 14, wherein the ammonium silicon fluoride layer is removed using deionized water.

20. A method of manufacturing a capacitor of a semiconductor device, comprising:
   forming an interlayer insulating layer with a contact plug on a semiconductor substrate;
   forming a mold oxide layer on the contact plug and the interlayer insulating layer;
   forming a mesh-type bridge insulating layer formed in a region above the contact plug on the mold oxide layer;
   etching the mold oxide layer and the bridge insulating layer to define an electrode region; and
   removing the mold oxide layer using a catalyst gas selected from the group consisting of IPA (isopropyl alcohol), an alcoholic material including $CH_3OH$, and a carboxylic acid including $CH_3COOH$.

* * * * *